(12) United States Patent
Kauffman et al.

(10) Patent No.: US 10,243,574 B2
(45) Date of Patent: Mar. 26, 2019

(54) APPARATUS FOR CORRECTING LINEARITY OF A DIGITAL-TO-ANALOG CONVERTER

(71) Applicant: Intel IP Corporation, Santa Clara, CA (US)

(72) Inventors: John G. Kauffman, Munich (DE); Udo Schuetz, Munich (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/334,218

(22) Filed: Oct. 25, 2016

(65) Prior Publication Data

US 2017/0063388 A1    Mar. 2, 2017

Related U.S. Application Data

(63) Continuation of application No. 14/736,155, filed on Jun. 10, 2015, now Pat. No. 9,509,326.

(51) Int. Cl.

| H03M 1/00 | (2006.01) |
|---|---|
| H03M 1/06 | (2006.01) |
| H03M 1/10 | (2006.01) |
| H03M 3/00 | (2006.01) |
| H03M 1/12 | (2006.01) |

(Continued)

(52) U.S. Cl.
CPC ........... *H03M 1/06* (2013.01); *H03M 1/0607* (2013.01); *H03M 1/1004* (2013.01); *H03M 1/1009* (2013.01); *H03M 3/422* (2013.01); *H03M 1/00* (2013.01); *H03M 1/12* (2013.01); *H03M 1/742* (2013.01); *H03M 1/804* (2013.01); *H03M 3/30* (2013.01); *H03M 3/454* (2013.01); *H03M 3/464* (2013.01)

(58) Field of Classification Search
CPC ............ H03M 1/00; H03M 3/30; H03M 1/12; H03M 1/804
USPC ................. 341/110, 155, 143, 156, 163, 172
See application file for complete search history.

(56) References Cited

U.S. PATENT DOCUMENTS

| 5,612,698 A * | 3/1997 | Reay ..................... H03M 1/181 |
|---|---|---|
| | | 341/155 |
| 8,031,098 B1 | 10/2011 | Ebner et al. |

(Continued)

OTHER PUBLICATIONS

Non-Final Office Action for U.S. Appl. No. 14/736,155 dated Mar. 24, 2016, 5 pages.

(Continued)

*Primary Examiner* — Joseph J. Lauture
(74) *Attorney, Agent, or Firm* — Green, Howard & Mughal LLP

(57) ABSTRACT

Described is an apparatus which comprises: a digital-to-analog converter (DAC) having a DAC cell with p-type and n-type current sources and an adjustable strength current source which is operable to correct non-linearity of the DAC cell caused by both the p-type and n-type current sources; and measurement logic, coupled to the DAC, having a reference DAC cell with p-type and n-type current sources, wherein the measurement logic is to monitor an integrated error contributed by both the p-type and n-type current sources of the DAC cell, and wherein the measurement logic is to adjust the strength of the adjustable strength current source according to the integrated error and currents of the p-type and n-type current sources of the reference DAC cell.

29 Claims, 9 Drawing Sheets

(51) Int. Cl.
*H03M 1/80* (2006.01)
*H03M 1/74* (2006.01)

(56) References Cited

U.S. PATENT DOCUMENTS

| | | | | |
|---|---|---|---|---|
| 9,543,978 | B2* | 1/2017 | Mattisson | H03M 3/344 |
| 2005/0068213 | A1* | 3/2005 | Fontaine | H03M 3/37 |
| | | | | 341/143 |
| 2006/0145902 | A1* | 7/2006 | Tucholski | H03M 1/66 |
| | | | | 341/144 |
| 2009/0131010 | A1* | 5/2009 | Oshima | H03M 1/122 |
| | | | | 455/334 |
| 2011/0006933 | A1* | 1/2011 | Nagarajan | H03M 1/1057 |
| | | | | 341/118 |
| 2012/0105262 | A1* | 5/2012 | Rao | H03M 1/123 |
| | | | | 341/155 |
| 2012/0200437 | A1* | 8/2012 | Moue | H03M 3/386 |
| | | | | 341/110 |
| 2012/0326904 | A1* | 12/2012 | Jensen | H03M 3/396 |
| | | | | 341/131 |
| 2013/0021184 | A1* | 1/2013 | Ashburn, Jr. | H03M 3/374 |
| | | | | 341/143 |
| 2014/0125504 | A1* | 5/2014 | Braswell | H03M 3/344 |
| | | | | 341/110 |

OTHER PUBLICATIONS

Notice of Allowance for U.S. Appl. No. 14/736,155 dated Jul. 20, 2016, 7 pages.

* cited by examiner

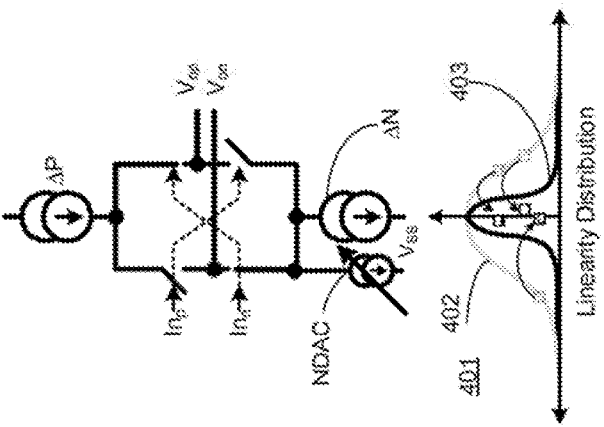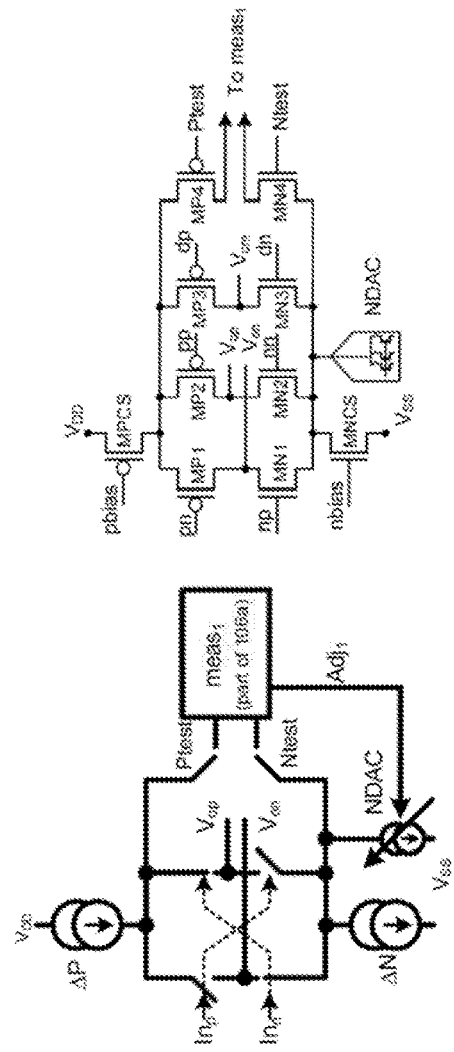
Fig. 4A  Fig. 4B  Fig. 4C even order harmonics are corrected by adjusting the current
APPARATUS FOR CORRECTING LINEARITY OF A DIGITAL-TO-ANALOG CONVERTER

CLAIM FOR PRIORITY

This application is a continuation of prior U.S. patent application Ser. No. 14/736,155, filed on 10 Jun. 2015 and titled "APPARATUS FOR CORRECTING LINEARITY OF A DIGITAL-TO-ANALOG CONVERTER," which issues as U.S. Pat. No. 9,509,326, on 29 Nov. 2016, and which is incorporated by reference in entirety.

BACKGROUND

Digital-to-Analog Converters (DACs) are used to convert an input digital signal (e.g., binary data) to a corresponding analog signal (e.g., current or voltage). Performance of a DAC is described with reference to one or more characteristics. For example, resolution, maximum sampling rate, monotonicity, total harmonic distortion and noise, dynamic range (e.g., spurious-free dynamic range), gain, offset, differential non-linearity, integral non-linearity, noise, signal-to-noise ratio, time non-linearity, etc. Correcting non-linearity of a DAC is a challenge.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 4A illustrates a DAC cell with a single adjustable source for improving linearity of the DAC cell, according to some embodiments of the disclosure.

FIG. 4B illustrates a DAC cell with a single adjustable source and associated measurement apparatus, according to some embodiments of the disclosure.

FIG. 4C illustrates a transistor level design of the DAC cell of FIG. 4B, according to some embodiments of the disclosure.

DETAILED DESCRIPTION

Figure 1:
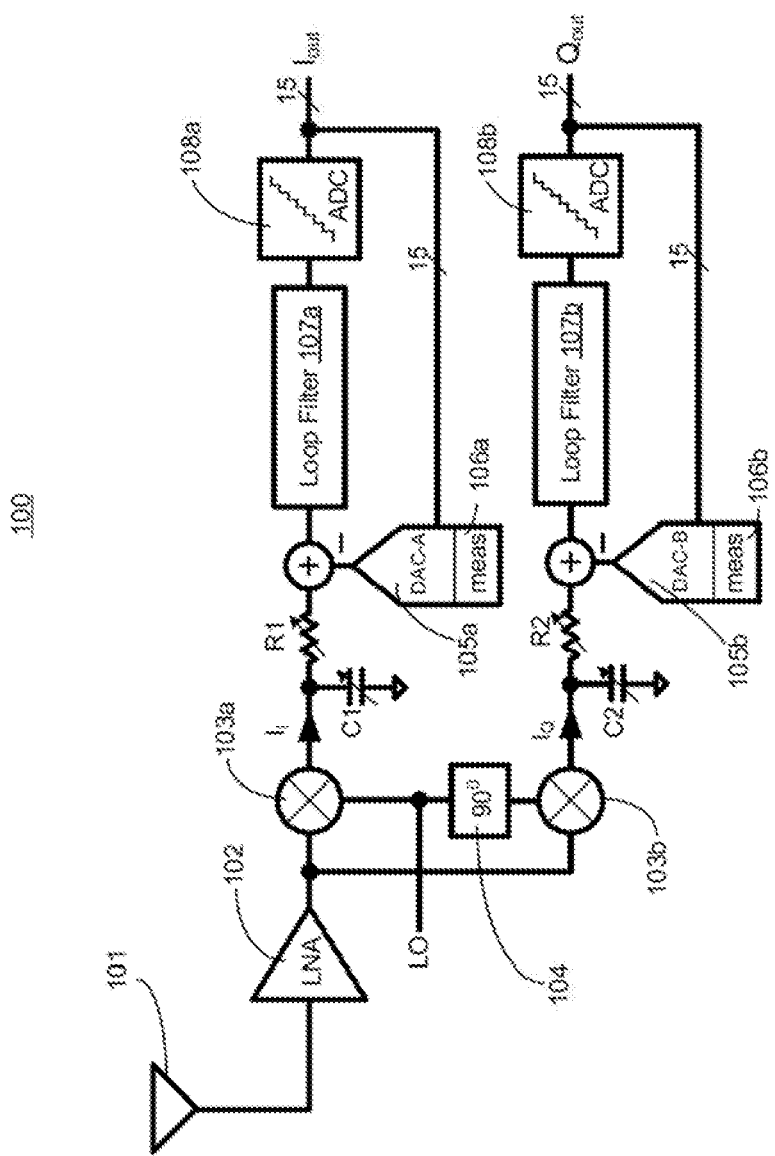
FIG. 1 illustrates front-end of a radio-frequency (RF) apparatus with Digital-to-Analog Converters (DACs), according to some embodiments of the disclosure.

Some embodiments describe an apparatus which comprises: a digital-to-analog converter (DAC) having a DAC cell with p-type and n-type current sources and an adjustable strength current source which is operable to correct the non-linearity of the DAC cell caused by both the p-type and n-type current sources. For example, a single adjustable strength current source is used to correct the non-linearity caused by the p-type and n-type current sources of the DAC cell. In some embodiments, the apparatus further comprises measurement logic, coupled to the DAC, having a reference DAC cell with p-type and n-type current sources. In some embodiments, the measurement logic monitors an integrated error contributed by both the p-type and n-type current sources of the DAC cell. In some embodiments, the measurement logic adjusts the strength of the adjustable strength current source according to the integrated error and currents of the p-type and n-type current sources of the reference DAC cell. In some embodiments, odd order harmonics and even order harmonics are corrected by adjusting the current strength of the adjustable current source and by using a dumping algorithm.

There are many technical effects of the various embodiments. For example, in some embodiments, the area of circuits used for correcting the non-linearity of the DAC is reduced compared to traditional means. Traditional means use at least two different measurement circuits for correcting errors caused by the p-type and n-type current sources of the DAC cell. As such, the traditional means are complex in design because each current source is separately corrected by the measurement circuits and have a large left-over error $$\left(\text{e.g., } \sqrt{\left(\frac{LSBN}{2}\right)^2 + \left(\frac{LSBp}{2}\right)^2}\right).$$

The apparatuses of various embodiments achieve better linearity for their DACs with lesser area and lower power. For example, a linearity greater than 80 dB Total Harmonic Distortion (THD) is achieved by the DACs of some embodiments. In some embodiments, the apparatus corrects the error to half the Least Significant Bit (LSB) LSB/2 (e.g., half of the Least Significant Bit of an n-type adjustable current source coupled in parallel to the n-type current source of the DAC cell), which is much less than the left-over error from traditional correcting means. In some examples, the DAC correction by the various embodiments corrects the non-linearity to 0.01%. Other technical effects will be evident from the description of the various embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical, mechanical, or magnetic connection between the things that are connected, without any intermediary devices. The term "coupled" means either a direct electrical, mechanical, or magnetic connection between the things that are connected or an indirect connection through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% (unless otherwise specified) of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

For purposes of the embodiments, the transistors in various circuits, modules, and logic blocks are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure.

FIG. 1 illustrates a front-end of an radio-frequency (RF) apparatus 100 with DACs, according to some embodiments of the disclosure. Apparatus 100 receives an input signal and generates In-phase (I) and Quadrature (Q) signals, $I_{out}$ and $Q_{out}$, respectively. In this example, the output signals $I_{out}$ and $Q_{out}$ are 15-bit thermometer coded signals. However, the embodiments are not limited to such. Fewer or more bits may be used for $I_{out}$ and $Q_{out}$. Here, node names and signal names are interchangeably used. For example, the term "$I_{out}$" may refer to the In-phase node or signal on that node depending on the context of the sentence.

In some embodiments, apparatus 100 comprises: an Antenna 101, Low Noise Amplifier (LNA) 102, Mixers 103a and 103b, Phase Shifter 104, Low-Pass Filters (R1-C1, and R2-C2), DACs 105a and 105b with integrated Measurement Circuits 106a and 106b, respectively, Loop Filters 107a and 107b, and Analog-to-Digital Converters (ADCs) 108a and 108b.

In some embodiments, Antenna 101 may comprise one or more directional or omnidirectional antennas, including monopole antennas, dipole antennas, loop antennas, patch antennas, microstrip antennas, coplanar wave antennas, or other types of antennas suitable for transmission of Radio Frequency (RF) signals. In some multiple-input multiple-output (MIMO) embodiments, Antenna(s) 101 are separated to take advantage of spatial diversity.

In some embodiments, LNA 102 receives an input from Antenna 101 and converts the weak signal received from Antenna 101 to an amplified output. Any suitable design for LNA that achieves low noise figure (NF) (e.g., 1 dB) and high gain (e.g., 20 dB) can be used for implementing LNA 102.

In some embodiments, Mixers 103a and 103b are switching mixers that receive the output of LNA 102 and mix the frequency of that output by a local oscillator (LO) frequency and its phase shifted version (e.g., phase shifted by Shifter 104). Any suitable mixer design can be used for implementing Mixers 103a and 103b. In some embodiments, the outputs of Mixers 103a and 103b (i.e., $I_I$ and $I_Q$) are filtered by respective filters (R1-C1 and R2-C2).

In some embodiments, the analog signals (generated by DACs 105a and 105b) are subtracted from the input of the integrator. In some embodiments, each DAC has a corresponding measurement circuit. For example, DAC 105a (i.e., DAC-A) is coupled to Measurement Circuit 106a (i.e., meas) while DAC 105b (i.e., DAC-B) is coupled to Measurement Circuit 106b (i.e., meas). Any suitable DAC may be used for implementing DACs 105a/b such that their linearity is correctable by one adjustable current source per DAC and controllable by the respective measurement circuit, in accordance with some embodiments. In some embodiments, the Measurement Circuits 106a/b include an integrator, a reference cell which mimics the design (ie., function and structure) of a DAC cell, and a Finite State Machine (FSM) for selectively adjusting the current of the adjustable current source in the target DAC cell, where the target DAC cell is the cell being tested or calibrated to improve linearity.

In some embodiments, Loop Filters 107a/b comprise of integrators. In some embodiments, the number of integrators determine the order of the filter and can be built to any order. By adjusting the number of integrators in Loop Filters 107a/b, different types of transfer functions can be implemented. In various embodiments, a third order loop low pass filter is presented with no signal transfer peaking. In some embodiments, integrators$_{1-3}$ are built with as active RC integrators. In other embodiments, other types of implementations may be used for building integrators$_{1-3}$. For example, GM-C integrators, passive RC integrator, etc. can be used for building integrators$_{1-3}$. In some embodiments, the feedback of Loop Filters 107a/b is a feed-forward. In other embodiments, other types of feedback mechanisms can be used. For example, traditional feedback or a hybrid of traditional feedback and feed-forward paths can be used for implementing the feedback path Filters 107a/b.

In some embodiments, ADCs 108a/b convert the analog output of Loop Filters 107a/b to their corresponding digital representations. Any suitable ADC may be used to implement ADC 108a/b. For example, ADC 108a/b is one of: direct-conversion ADC (for flash ADC), successive-approximation ADC, ramp-compare ADC, Wilkinson ADC, integrating ADC, delta-encoded ADC or counter-ramp, pipeline ADC (also called subranging quantizer), sigma-delta ADC (also known as a delta-sigma ADC), time-interleaved ADC, ADC with intermediate FM stage, or time-stretch ADC.

Figure 2:
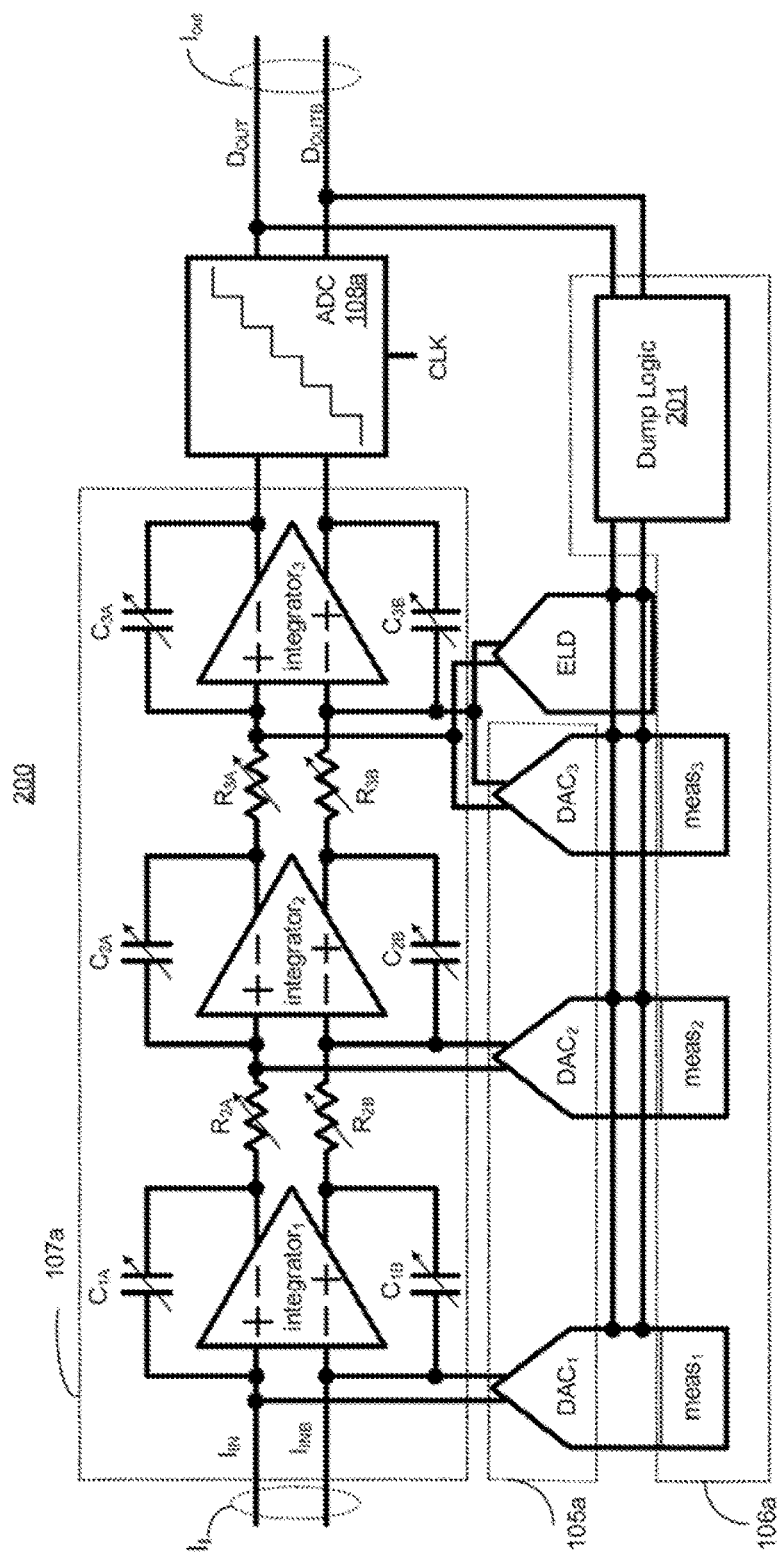
FIG. 2 illustrates a sigma-delta modulator based Analog-to-Digital Converter that uses one or more DACs, according to some embodiments of the disclosure.

FIG. 2 illustrates sigma-delta modulator ADC 200 that uses one or more DACs, according to some embodiments of the disclosure. It is pointed out that those elements of FIG. 2 having the same reference numbers (or names) as the elements of any other figure can operate or function in any manner similar to that described, but are not limited to such. So as not to obscure the embodiments, the In-plane path is shown (i.e., I-path). The Quadrature path (i.e., the Q-path) is similar to the I-path except that the input is modulated using a LO frequency shifted by 90°.

In some embodiments, sigma-delta modulator ADC 200 comprises a closed loop circuit including Loop filter 107a, ADC 108a, Measurement Circuit 106a, and DAC 105a. In some embodiments, an Excess Loop Delay (ELD) recovery circuit is coupled to the last DAC cell (here, $DAC_3$). In some embodiments, ELD recovery circuit is used to stabilize sigma-delta modulator ADC 200 in the presence of delay in ADC 108a or other delays within the feedback loop. In some embodiments, ELD recovery circuit has a programmable delay that can be programmed by hardware (e.g., fuses) or software. In some embodiments, ELD recovery circuit has a predetermined delay.

In some embodiments, sigma-delta modulator ADC 200 is a single order sigma-delta modulator ADC. In one such embodiment, $DAC_2$, $integrator_2$, $meas_2$, $DAC_3$, $integrator_3$, and $meas_3$ are not used, and the output of sigma-delta modulator ADC 200 is fed back to $DAC_1$ which closes the loop filter 107a. In some embodiments, sigma-delta modulator ADC 200 is a multi-order sigma-delta modulator ADC. One such embodiment is shown in FIG. 2 which is a third order sigma-delta modulator ADC. While the various embodiments are described with reference to a multi-order sigma-delta modulator ADC, the embodiments are also applicable to a single order sigma-delta modulator ADC.

In some embodiments, Loop Filter 107a comprises three integrators—$integrators_{1-3}$, adjustable capacitors $C_{1A}$, $C_{1B}$, $C_{2A}$, $C_{2B}$, $C_{3A}$, $C_{3B}$, and adjustable resistors $R_{2A}$, $R_{2B}$, $R_{3A}$, and $R_{3B}$ coupled together as shown. While the embodiments illustrate a differential Loop Filter 107a that receives differential inputs $I_{IN}$ and $I_{INB}$, the embodiments are applicable to a single-ended loop filter. In this example, the differential inputs are differential currents $I_{IN}$ and $I_{INB}$. However, the embodiments are not limited to input currents. In some embodiments, the input currents from Mixers 103a and 103b can be converted to voltages and those voltages are input to respective Loop Filters 107a and 107b. In some embodiments, input resistors (e.g., $R_{2A}$, $R_{2B}$, $R_{3A}$, and $R_{3B}$ which are coupled to inputs of $integrators_{2-3}$) are used to convert the output voltage (i.e., the output of the previous integrator) back into current.

In some embodiments, DAC(s) 105a subtract an analog signal from the input of Loop Filter 107a to complete a closed loop for generating a running average for the outputs $D_{OUT}$ and $D_{OUTB}$. In this example, a multi-order sigma-delta modulator based ADC is described which includes $DAC_1$, $DAC_2$, and $DAC_3$. In some embodiments, each DAC has one or more DAC cells with one adjustable current source which is adjustable by a corresponding measurement circuit of the DAC. Traditional multi-bit sigma-delta ADCs have limited performance (e.g., limited linearity) due to their outer most feedback DAC linearity because errors introduced at the ADC input are directly seen at the ADC output.

The limited performance of traditional multi-bit sigma-delta ADCs is mitigated by the apparatus of the various embodiments.

In some embodiments, $DAC_1$ subtracts an analog signal from input analog signal(s) which are input to $integrator_1$. In this example, the analog signal(s) from $DAC_1$ are differential currents which are subtracted from the input differential currents $I_{IN}$ and $I_{INB}$. In some embodiments, $DAC_2$ subtracts an analog signal from the input analog signal(s) which are input to $integrator_2$. In this example, the analog signal(s) from $DAC_2$ are differential currents which are subtracted from the input differential currents that are input to $integrator_2$, where the input differential currents here are the output(s) of $integrator_1$. In some embodiments, $DAC_3$ subtracts an analog signal from the input analog signal(s) which are input to $integrator_3$. In this example, the analog signal from $DAC_3$ are differential currents which are subtracted from input differential currents that are input to $integrator_3$, where the input differential currents here are the output(s) of $integrator_2$.

In some embodiments, Measurement Circuits 106a coupled to DACs 105a correct linearity of the DACs. In some embodiments, each DAC has its associated measurement circuit. For example, $DAC_1$ is coupled to $meas_1$, $DAC_2$ is coupled to $meas_2$, and $DAC_3$ is coupled to $meas_3$. In some embodiments, each measurement circuit of 106a includes a reference cell. In some embodiments, the reference cell is used to make the corrections for all DAC cells within the DAC to have the same characteristics (e.g., linearity) as that of the reference cell. As such, odd and even order harmonics are corrected and some or all even order harmonics are also corrected. In some embodiments, Dump Logic 201 is provided which performs a dumping algorithm to further correct even order harmonics. For example, to correct even order harmonics that were not corrected by DACs 105a, Dump Logic 201 can be used to correct those even order harmonics.

Figure 3:
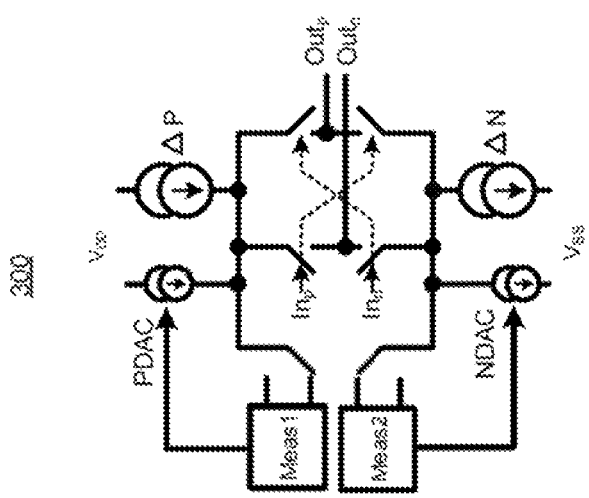
FIG. 3 illustrates a typical DAC cell that uses at least two measurement circuits and corresponding two adjustable current sources for adjusting linearity of the DAC.

FIG. 3 illustrates apparatus 300 showing a typical DAC cell that uses at least two measurement circuits and corresponding two adjustable current sources for adjusting linearity of the DAC. In this example, a differential current DAC is illustrated having two current sources—a p-type current source ΔP and an n-type current source ΔN—four switches controllable by $In_p$ and $In_n$, switches for coupling the p-type current source ΔP to a first measurement circuit and for coupling the n-type current source ΔN to a second measurement circuit, and output nodes $Out_p$ and $Out_n$. Here, the two adjustable current sources (i.e., auxiliary DACs) PDAC and NDAC are provided which are adjustable by respective measurement circuits. As such, the two measurement circuits are used to correct the linearity of the traditional DACs.

The two adjustable current sources, PDAC and NDAC, are coupled in parallel to the DAC current sources. For example, PDAC is coupled in parallel to ΔP and NDAC is coupled in parallel to ΔN. The two auxiliary DACs result in large area since each DAC (i.e., NDAC and PDAC) needs to have an overall LSB (Least Significant Bit) matching in order to correct the main DAC cell (i.e., the cell having the p-type current source ΔP and the n-type current source ΔN, and the four switches controllable by $In_p$ and $In_n$). Also, since there are two current sources, ΔP and ΔN, which need to be measured, the complexity increases in connecting the current sources to respective measurement circuits. These issues are mitigated by the DAC cell of the various embodiments.

FIG. 4A illustrates DAC cell 400 (e.g., $DAC_1$ which is part of DAC 105a) with a single adjustable source for improving the linearity of the DAC cell, according to some embodiments of the disclosure. It is pointed out that those elements of FIG. 4A having the same reference numbers (or names) as the elements of any other figure can operate or function in any manner similar to that described, but are not limited to such. So as not to obscure the embodiment of FIG. 4A, differences between FIG. 3 and FIG. 4A are highlighted.

In some embodiments, DAC cell 400 is similar to DAC cell 300 but it has one adjustable current source which is adjustable by a measurement circuit instead of two or more adjustable current sources. Here, instead of two measurement circuits, one measurement circuit is used, in according with some embodiments. In some embodiments, the adjustable current source is a p-type current source DAC (not shown). In some embodiments, the adjustable current source is an n-type current source DAC, NDAC.

Here, plot 401 is a Gaussian distribution 403 for the corrected linearity of DAC cell 400 compared to the Gaussian distribution 402 of the linearity of a DAC cell without any linearity correcting apparatus. As illustrated, DAC cell 400 has a narrower bell-curve compared to the bell-curve of the DAC cell without any linearity correcting apparatus. As such, DAC cell 400 is more linear than a DAC cell without any linearity correcting apparatus, according to some embodiments.

FIG. 4B illustrates DAC cell 420 with a single adjustable source and associated measurement apparatus, according to some embodiments of the disclosure. It is pointed out that those elements of FIG. 4B having the same reference numbers (or names) as the elements of any other figure can operate or function in any manner similar to that described, but are not limited to such. DAC cell 420 is one of the DAC cells of DAC 105a. For example, DAC cell 420 is $DAC_1$ with its corresponding measurement circuit $meas_1$. So as not to obscure the embodiment of FIG. 4B, differences between FIG. 3 and FIG. 4B are described.

Instead of two measurement circuits as used by DAC cell 300, DAC cell 400 has one adjustable current source NDAC controllable by one measurement circuit $meas_1$ (which is part of 106a). In some embodiments, the adjustable current source NDAC is controllable by $Adj_1$, which is generated by measurement circuit $meas_1$. In some embodiments, DAC cell 420 (e.g., $DAC_1$) includes switches controllable by Ptest and Ntest signals. In some embodiments, Ptest and Ntest signals are generated by the measurement circuit $meas_1$ and are used for coupling the p-type current source ΔP to the measurement circuit $meas_1$ and the n-type current source ΔN and NDAC to the measurement circuit $meas_1$. By using one adjustable current source NDAC and one measurement circuit $meas_1$ to correct linearity of the DAC cell, area and power are reduced along with reducing complexity of traditional DAC cells.

FIG. 4C illustrates transistor level design 430 of the DAC cell of FIG. 4B, according to some embodiments of the disclosure. It is pointed out that those elements of FIG. 4C having the same reference numbers (or names) as the elements of any other figure can operate or function in any manner similar to that described, but are not limited to such.

In some embodiments, transistor level design 430 of the DAC cell of FIG. 4B, includes p-type transistors MPCS, MP1, MP2, MP3, and MP4; n-type transistors MNCS, MN1, MN2, MN3, and MN4; and NDAC with switchable transistors to provide adjustable current strength. Transistors MPCS and MNCS are the current sources ΔP and ΔN which are biased by the pbias and nbias bias signals, respectively.

The bias signals can be generated by any suitable bias generating circuit (e.g., a diode connected device, bandgap circuit, resistor divider, etc.). Transistors MP1 and MN2 are controlled by pn and nn signals, respectively, which are the same as $In_p$. Transistors MP2 and MN1 are controlled by pp and np signals, respectively, which are the same as $In_n$.

In some embodiments, transistors MP3 and MN3, which are coupled together in series, are controlled by signals dp and dn, respectively, which are generated by Dump Logic 201. The common node of transistors MP3 and MN3 is $V_{cm}$. Here, transistor MP3 is coupled to the p-type current source MPCS while transistor MN3 is coupled to the n-type current source MNCS. In some embodiments, when the DAC cell is being dumped, dp and dn signals cause transistors MP3 and MN3 to turn on, and as such the p-type current source MPCS is electrically shorted to the n-type current source MNCS. In some embodiments, a single transistor for dumping is coupled between the p-type current source MPCS and the n-type current source MNCS instead of the two series coupled transistors MP3 and MN3. In some embodiments, the DAC cell is coupled to the measurement circuit $meas_1$ via transistors MP4 and MN4, where transistor MP4 is controllable by Ptest signal and transistor MN4 is controllable by Ntest signal.

Figure 5:
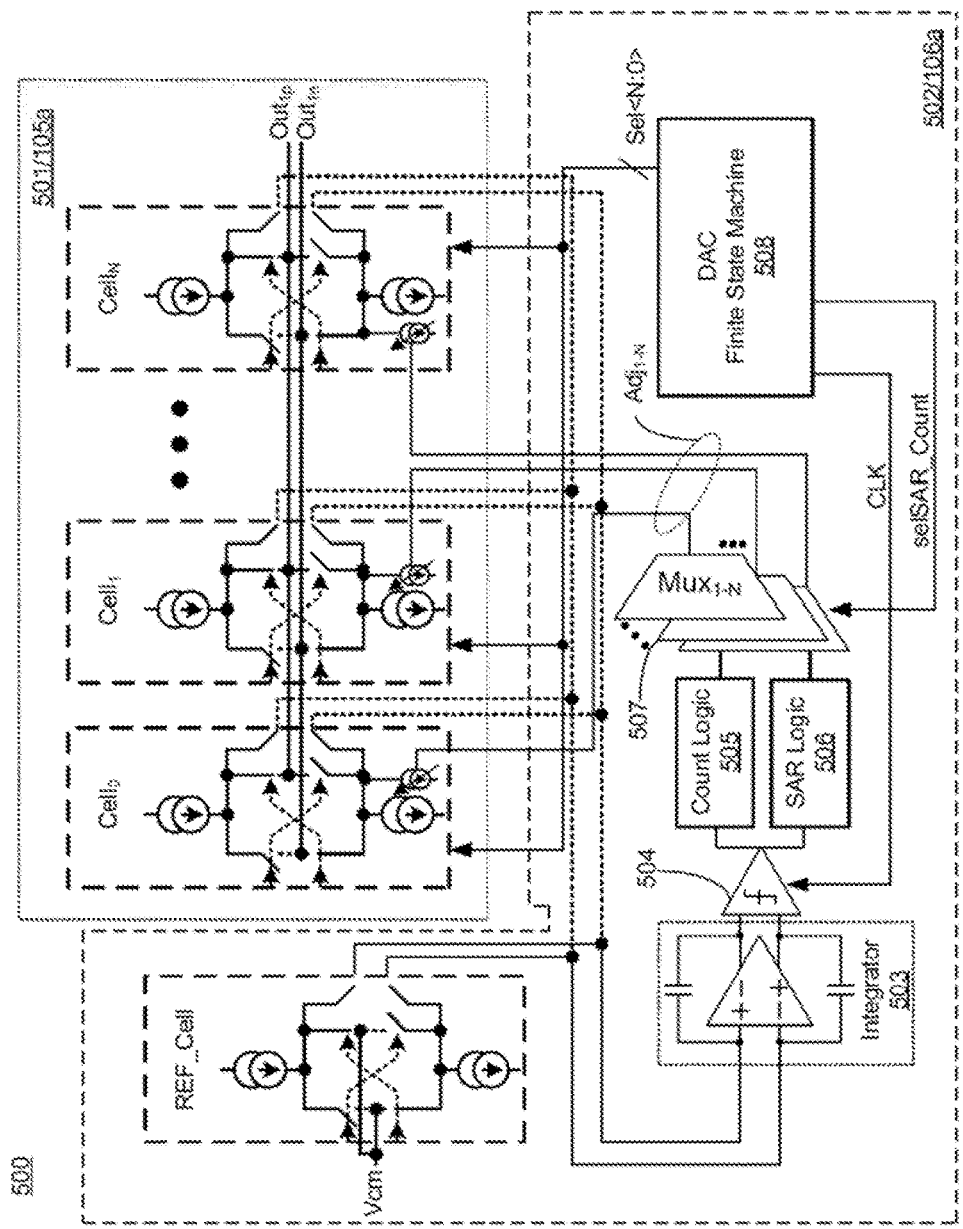
FIG. 5 illustrates a DAC cell with an associated measurement apparatus, according to some embodiments of the disclosure.

FIG. 5 illustrates apparatus 500 with DAC 501/105a (e.g., $DAC_1$) and associated Measurement Circuit/apparatus 502/106a (e.g., $meas_1$), according to some embodiments of the disclosure. It is pointed out that those elements of FIG. 5 having the same reference numbers (or names) as the elements of any other figure can operate or function in any manner similar to that described, but are not limited to such.

In some embodiments, DAC 501/105a includes 'N' DAC cells (e.g., DAC cell 430), where 'N' is an integer greater than one. For example, 'N' is equal to fifteen. In some embodiments, each DAC cell is selectively coupled to Measurement Circuit 502/106a via select signal(s) Sel<N:0>. For example, $Cell_0$ is selected by Sel<0>, $Cell_1$ is selected by Sel<1>, and $Cell_N$ is selected by Sel<N>. In one example, N=15 which means there are 16 DAC cells. In some embodiments, an extra DAC cell is used when performing the operation of correcting linearity. As such, when a DAC cell is being corrected and connected to Measurement Circuit 502/106a, the extra DAC cell is used by sigma-delta modulator based ADC 200 for it to function correctly. Continuing with the example, at any point, 15 DAC cells are functioning while one of them is being corrected by Measurement Circuit 502/106a.

In some embodiments, Measurement Circuit 502/106a comprises a reference cell (REF_Cell), Integrator 503, Clocked Comparator 504, Count Logic 505, Successive Approximation Register (SAR) Logic 506, 'N' multiplexers ($MUX_{1-N}$, and DAC Finite State Machine (FSM) 508.

In some embodiments, REF_Cell has the same design as any one of the DAC cells but without the adjustable NDAC. In some embodiments, all cells of DAC 501/105a are corrected to be the same as the REF_Cell. For example, NDAC of each DAC Cell is adjusted so that the DAC Cell has the same linearity as the REF_Cell. In some embodiments, DAC FSM 508 individually selects one DAC Cell at a time and couples it to Integrator 503. For example, DAC FSM 508 generates select signal Sel<0> to couple DAC $Cell_0$ to Integrator 503. In some embodiments, outputs $V_{op}$ and $V_{on}$ of the selected DAC Cell are integrated by Integrator 503.

In some embodiments, the outputs of Integrator 503 are compared by Clocked Comparator 504 (which is clocked by a clock signal CLK and generated by DAC FSM 508). In some embodiments, the output of Clocked Comparator 504 indicates a direction of the integrated error between the integrated versions of $Out_1$ and $Out_{1b}$. For example, the direction of the integrated error (i.e., the output of Clocked Comparator 504) can be positive or negative. In some embodiments, the output of Clocked Comparator 504 is received as input by Count Logic 505 and SAR Logic 506 which generate a code according to the error between the integrated versions of $Out_1$ and $Out_{1b}$.

In some embodiments, Count Logic 505 is an up/down counter that uses the direction of the integrated error as a control signal for counting up or down a count value. As such, the direction of the integrated error provides a digital code (i.e., the count value $Adj_{1-N}$). Any known counter can be used for implementing Count Logic 505.

In some embodiments, SAR Logic 506 implements a SAR algorithm that generates control signals ($Adj_{1-N}$, where 'N' is an integer greater than one) for controlling the NDAC of the selected DAC Cell. In some embodiments, SAR Logic 506 is an ADC that converts a continuous analog waveform (e.g., integrated error signal) into a discrete digital representation (i.e., $Adj_{1-N}$) via a binary search through all possible quantization levels before finally converging upon a digital output for each conversion. Any known SAR ADC may be used for implementing SAR Logic 506.

In some embodiments, DAC FSM 508 selects one of the outputs of Count Logic 505 and SAR Logic 506 via $MUX_{1-N}$ (using SelSAR_Count signal) to control the current strength of the adjustable current source NDAC of the selected DAC Cell.

In some embodiments, if the output of Count Logic 505 is selected, then the current strength of the NDAC of the selected DAC Cell is adjusted by increasing or decreasing its current strength (i.e., depending on whether the counter of Count Logic 505 counts up or down). In some embodiments, if the output of SAR Logic 506 is selected, then the current strength of NDAC of the selected DAC Cell is adjusted by increasing or decreasing its current strength (i.e., depending on the SAR algorithm).

In some embodiments, the feedback process continues to reduce the integrated error till it reaches a predetermined threshold (e.g., LSB/2 of the NDAC resolution). As such, the linearity of the selected DAC Cell is corrected to the predetermined error level. After that, DAC FSM 508 selects the next DAC Cell and starts the process of correcting the linearity of that DAC Cell.

In some embodiments, at startup (e.g., during a power-up event) or when the processor having apparatus 500 is activated (e.g., turned on), FSM 508 selects SAR Logic 506 (which executes a SAR algorithm to correct the DAC cells). For example, when a DAC Cell is selected, its outputs ($Out_1$ and $Out_{1b}$) are integrated and then compared to generate a direction of the integrated error for adjusting the current source of the NDAC of the selected DAC Cell. This process continues up until all DAC Cells of DAC 501 are corrected.

In some embodiments, after startup or after the apparatus is powered on, FSM 508 enters the counter logic mode which can be considered a monitor mode. In this monitor mode each DAC cell is slowly rotated (i.e., each DAC cell couples one at a time to Measurement Circuit 502) to correct the linearity of the DAC Cell in background. For example, due to temperature change or aging of transistors from long term operation of RF receiver 100, the DAC Cells may become non-linear and the NDAC code set at startup may not provide the linearity it used to. In such cases, DAC FSM 508 slowly corrects the linearity of each DAC Cell. In some embodiments, when SAR Logic 506 is used at startup, the counter logic is then selected to correct one LSB for the NDAC of the selected DAC Cell and is changed at a low frequency so as to not produce tones in the bandwidth of ADC 200.

Figure 6:
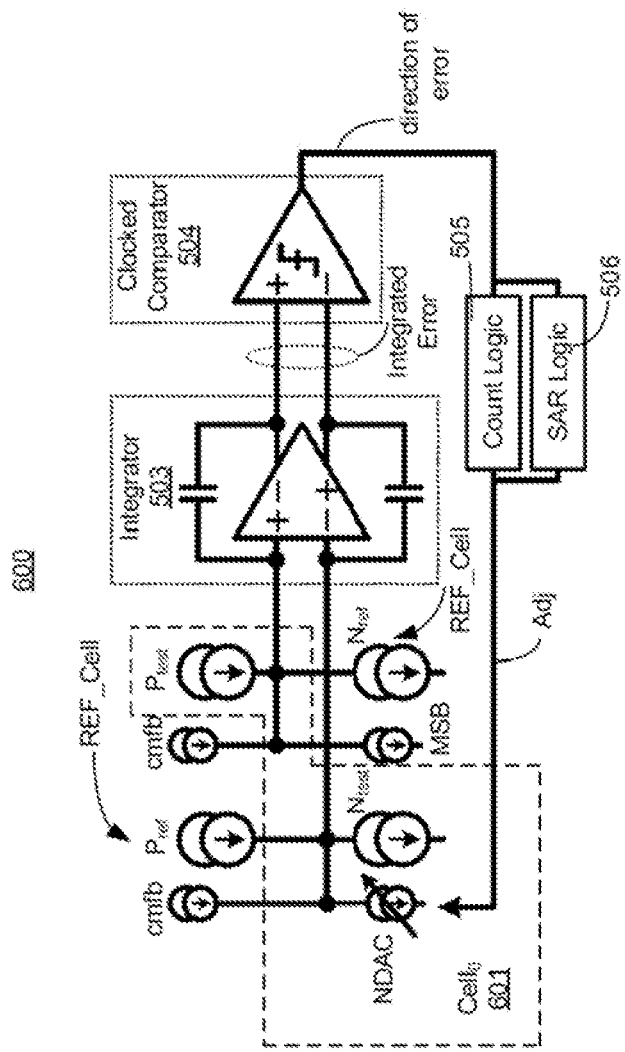
FIG. 6 illustrates an apparatus showing a reference cell coupled to a DAC cell under test, according to some embodiments of the disclosure.

FIG. 6 illustrates apparatus 600 showing a reference cell (REF_Cell) coupled to a DAC cell under test (e.g., DAC $Cell_0$), according to some embodiments of the disclosure. It is pointed out that those elements of FIG. 6 having the same reference numbers (or names) as the elements of any other figure can operate or function in any manner similar to that described, but are not limited to such.

In some embodiments, the node coupling current source Nref (i.e., reference for current source ΔN) of REF_Cell is compared to the node coupling Ptest (i.e., current source ΔP) of DAC Cell 601 (e.g., DAC $Cell_0$). In some embodiments, the node coupling the current source Pref (i.e., reference for current source ΔP) of the REF_Cell is compared to the node coupling Ntest (i.e., the current source ΔN and NDAC) of the DAC Cell (e.g., DAC $Cell_0$). In some embodiments, since one adjustable current source NDAC is used to correct the linearity of a DAC Cell, a MSB (Most Significant Bit) shift is used in the measurement circuit to provide plus/minus correction for all DAC mismatches. One reason for the MSB shift is that the measured error can be plus/minus while a small compact NMOS NDAC is used which pulls current out of the cell.

In some embodiments, because of the MSB shift, a common mode feedback (cmfb) is used to regulate the input of Integrator 503 which is used to integrate the error seen between Nref and Ntest. In some embodiments, cmfb is set by having an amplifier (not shown) monitor both the inputs of Integrator 503 and adjust the current source cmfb to keep the DC level at Vcm (i.e., common mode voltage). In some cases, the matching of the two cmfb current sources may use high matching so that the correction range of the auxiliary NDAC does not exceed its range limit. In some embodiments, the mismatch is reduced by increasing the overall size of the cmfb amplifier input and output stages (not shown).

In some embodiments, the output of Clocked Comparator 504 is used to indicate whether the error is positive or negative. In some embodiments, the output of Clocked Comparator 504 causes SAR Logic 506 to adjust its output code and thus adjust the current strength of NDAC till the integrated error becomes close to LSB/2.

For example, during the SAR mode (i.e., when SAR Logic 506 is selected), a 6-bit SAR is used with a 6-bit NDAC. When $Cell_0$ is selected, at first, the MSB of NDAC is set to 1, then Integrator 503 integrates the error which is then determined by Clocked Comparator 504. In some embodiments, if the integrated error is high (e.g., the direction of the integrated error is positive), then the MSB is kept at 1. In some embodiments, if the integrated error is low (e.g., the direction of the integrated error is negative), then the MSB is changed from 1 to 0. As such, the first SAR cycle completes. Then, the next SAR cycle starts where the MSB-1 is set to 1, and the process repeats as previously stated up until the LSB is evaluated and finally set, in accordance with some embodiments. In some embodiments, after all six SAR correction cycles complete, the DAC $Cell_0$ mismatches are trimmed within an LSB/2 of the NDAC resolution. As such, the linearity correction of DAC $Cell_0$ completes. The selection is then shifted to DAC $Cell_1$ and the process repeats up until all DAC cells are corrected for non-linearity.

In some embodiments, the output of Clocked Comparator 504 causes Counter Logic 505 to adjust its output code and thus adjust the current strength of NDAC till the integrated error becomes close to LSB/2. In one such embodiments, for each selection, Sel<1> through Sel<N>, Integrator 503 integrates the error with a lot more time than SAR Logic 506 takes. In some embodiments, to make sure no tones (e.g., harmonics) are created from rotating the DAC cells, the counter mode selection (i.e., the selection of DAC cells using the output of Counter Logic 505) is slowed down by slowing down the clock frequency to DAC FSM 508. As such, DAC cell selection (i.e., coupling of DAC cell to measurement circuit 502/106a) is slowed down. For example, when Counter Logic 505 is used, the $Adj_{1-N}$ signals toggle (for selecting purposes) in the 1 kHz range which is which is not within the Baseband Bandwidth of sigma delta ADC 200.

Figure 7:
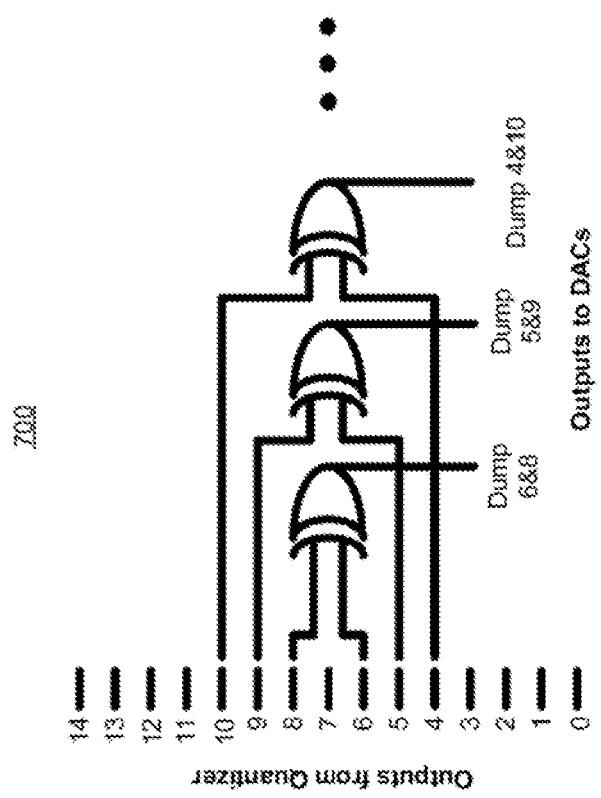
FIG. 7 illustrates an apparatus for performing a dumping algorithm, according to some embodiments of the disclosure.

FIG. 7 illustrates apparatus 700 (e.g., Dump Logic 201) for performing a dumping algorithm, according to some embodiments of the disclosure. It is pointed out that those elements of FIG. 7 having the same reference numbers (or names) as the elements of any other figure can operate or function in any manner similar to that described, but are not limited to such.

In some embodiments, Dump Logic 201 comprises exclusive-OR (XOR) logic gates that compare the outputs of the quantizer (i.e., ADC 108a) within the sigma-delta feedback loop and identify when the quantizer selects two DAC cells with opposite polarities. Here, the DAC cell polarities refer to a positive polarity when transistors MP2 (using pp) and MN1 (using np) in DAC Cell 430 are selected, and refer to a negative polarity when transistors MN2 (using nn) and transistor MP1 (using pn) in DAC Cell 430 430 are selected. In this example, 'N' is 15 (i.e., output of ADC 108a are 15 bits). In some embodiments, the compared cells are cells 6 and 8, 5 and 9, 4 and 10, 3 and 11, 2 and 12, 1 and 13, and 0 and 14 which then create the inputs to the DACs. In some embodiments, cell 7 is not dumped and functions like a normal cell.

When Dump Logic 201 identifies the case of opposite DAC cell polarities, both the DAC outputs may just cancel each other which may not be needed at this point. In some embodiments, when the XOR logic gates identify two DAC cells with opposite polarities, Dump Logic 201 sets signals dp and do for the two DAC cells to electrically short their path from the p-type current source ΔP to the n-type current source ΔN (i.e., DAC cells are "dumped").

The dumping process has at least two effects on the sigma-delta ADC—first is the removing of the noise of the DAC cells from the input of the ADC, and second is the removing of the even order harmonics generated from the DAC cells themselves.

Figure 8A:
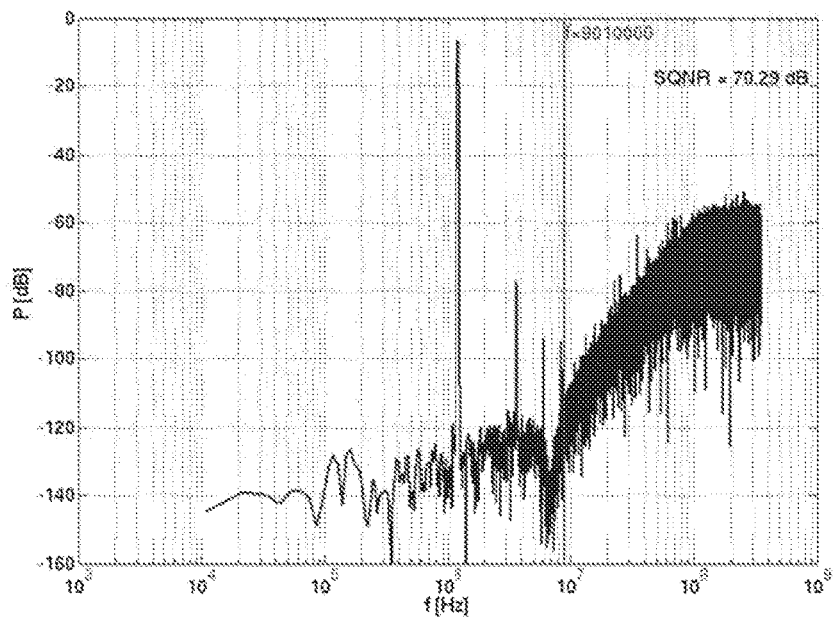
FIGS. 8A-B illustrate plots showing performance of a DAC with non-linearity and a DAC of various embodiments with improved linearity.
Figure 8B:
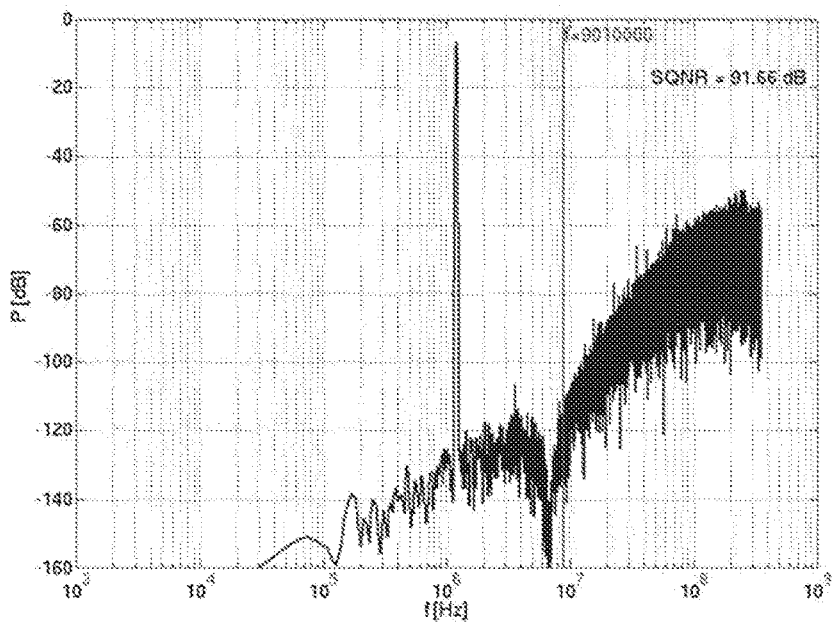

FIGS. 8A-B illustrate plots 800 and 820 showing the performance of a DAC with non-linearity and a DAC of various embodiments with improved linearity. It is pointed out that those elements of FIGS. 8A-B having the same reference numbers (or names) as the elements of any other figure can operate or function in any manner similar to that described, but are not limited to such. Here, x-axis is frequency and y-axis is a power spectral density (PSD). The integrated noise shown is the signal-to-quantization-noise ratio (SQNR) in dB, of sigma delta ADC 200 used in a Long Term Evolution (LTE) compliant RF Receiver. Here, SQNR indicates the linearity of the DAC. In this example, the SQNR of the RF sigma delta ADC in the LTE compliant Receiver without the embodiments for correcting DAC linearity is near 70 dB. Continuing with the example, the SQNR of the sigma delta ADC 200 in RF Receiver 100 with the embodiments for correcting DAC linearity is near 90 dB.

Figure 9:
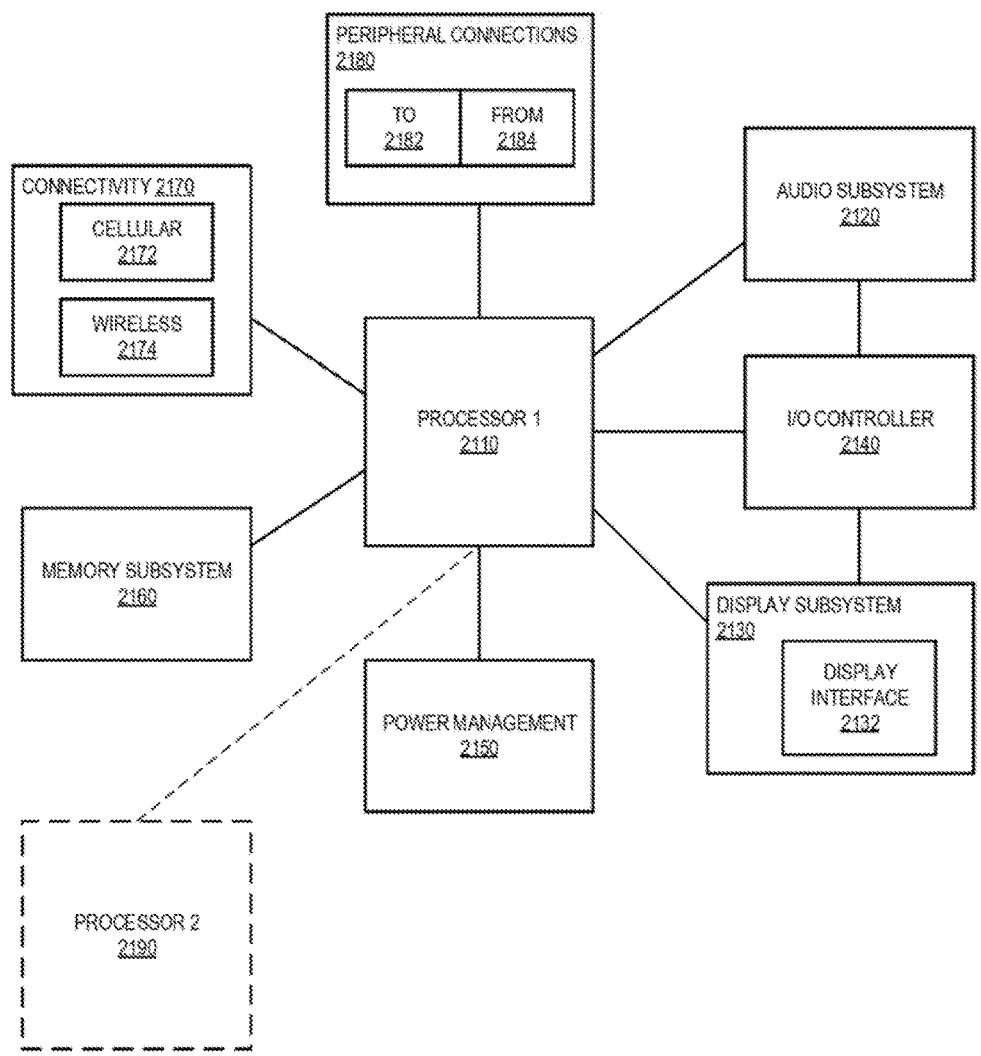
FIG. 9 illustrates a smart device or a computer system or a SoC (System-on-Chip) with an apparatus to improve linearity of a DAC, according to some embodiments.

FIG. 9 illustrates a smart device or a computer system or a SoC (System-on-Chip) 2100 with an apparatus to improve linearity of a DAC, according to some embodiments. It is pointed out that those elements of FIG. 9 having the same reference numbers (or names) as the elements of any other figure can operate or function in any manner similar to that described, but are not limited to such.

FIG. 9 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 with the apparatus to improve linearity of a DAC, according to some embodiments discussed. Other blocks of the computing device 2100 may also include the apparatus to improve linearity of a DAC, according to some embodiments. The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or processor 2190) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110. In some embodiments, audio subsystem 2120 includes an ADC with the apparatus to improve linearity of a DAC.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user. In some embodiments, Display subsystem 2130 includes an ADC with the apparatus to improve linearity of a DAC.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. Memory subsystem 2160 may include an ADC with the apparatus to improve linearity of a DAC, according to some embodiments.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication. In some embodiments, Cellular connectivity 2172 includes the apparatus to improve linearity of a DAC. For example, Cellular connectivity 2172 includes the front-end RF receiver of FIG. 1 with an ADC with apparatus to improve the linearity of a DAC.

Referring back to FIG. 9, in some embodiments, Peripheral connections 2180 include hardware interfaces and connectors, as well as software components (e.g., drivers, protocol stacks) to make peripheral connections. It will be understood that the computing device 2100 could be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a digital-to-analog converter (DAC) having a DAC cell with p-type and n-type current sources and an adjustable strength current source which is operable to correct non-linearity of the DAC cell caused by both the p-type and n-type current sources; and measurement logic, coupled to the DAC, having a reference DAC cell with p-type and n-type current sources, wherein the measurement logic is to monitor an integrated error contributed by both the p-type and n-type current sources of the DAC cell, and wherein the measurement logic is to adjust the strength of the adjustable strength current source according to the integrated error and currents of the p-type and n-type current sources of the reference DAC cell.

In some embodiments, the DAC cell and the reference DAC cell are current steering DAC cells. In some embodiments, the current steering DAC cells are differential current steering DAC cells. In some embodiments, the differential current steering DAC cells are differential switched current steering DAC cells. In some embodiments, the adjustable strength current source is a single current source for correcting the non-linearity of the DAC cell. In some embodiments, the adjustable strength current source is an n-type current source coupled in parallel to the n-type current source of the DAC cell.

In some embodiments, the adjustable strength current source is a p-type current source coupled in parallel to the p-type current source of the DAC cell. In some embodiments, the measurement circuit is operable to compare the p-type current source of the reference cell with the n-type current source of the DAC cell. In some embodiments, the measurement circuit is operable to compare the n-type current source of the reference cell with the p-type current source of the DAC cell. In some embodiments, the apparatus further comprises logic to perform a dumping algorithm on the DAC cell.

In some embodiments, the DAC cell comprises: a p-type switching cell coupled to the p-type current source of the DAC cell; and an n-type switching cell coupled to the n-type current source of the DAC cell. In some embodiments, the DAC cell further comprises a p-type transistor coupled in series with an n-type transistor, and wherein the p-type and n-type transistors are operable to electrically short the p-type current source to the n-type current source. In some embodiments, the DAC cell further comprises a p-type transistor coupled in series with the p-type current source, and wherein the p-type transistor is operable to couple the n-type current source to the reference DAC cell. In some embodiments, the DAC cell further comprises an n-type transistor coupled in series with the n-type current source, and wherein the n-type transistor is operable to couple the p-type current source to the reference DAC cell. In some embodiments, the apparatus comprises a switch for coupling the reference DAC cell with the DAC cell.

In another example, a system is provided which comprises: an antenna; a integrated circuit (IC) coupled to the antenna, the IC including and apparatus according to the apparatus described above; and a processor coupled to the IC.

In another example, a sigma-delta modulator is provided which comprises: an integrator to receive an input signal and to generate an output analog signal; a analog-to-digital converter (ADC) to convert the output analog signal to a digital representation; a digital-to-analog converter (DAC) to adjust the input current, the DAC having a DAC cell having a single adjustable strength current source coupled to one of p-type or n-type current sources of the DAC cell; and a measurement circuit to receive the digital representation and to control the single adjustable strength current source according to the digital representation.

In some embodiments, the measurement circuit is coupled to the DAC, and wherein the measurement circuit includes a reference DAC cell with p-type and n-type current sources. In some embodiments, the measurement circuit includes a multiplexer to select one of count-based or Successive Approximation Register (SAR)-based trimming method applicable to the single adjustable strength current source. In some embodiments, the single adjustable strength current source is operable to correct odd and even order harmonics. In some embodiments, the sigma-delta modulator comprises logic to perform a dumping algorithm to remove even order harmonics.

In another example, a system is provided which comprises: an antenna; a integrated circuit (IC) coupled to the antenna, the IC including a sigma-delta modulator according to the sigma-delta modulator described above; a processor coupled to the IC.

In another example, a method is provided which comprises: receiving an input signal and generating an output analog signal; converting the output analog signal to a digital representation; adjusting the input current, the DAC having a DAC cell having a single adjustable strength current source coupled to one of p-type or n-type current sources of the DAC cell; and receiving the digital representation and controlling the single adjustable strength current source according to the digital representation.

In some embodiments, the method comprises selecting one of count-based or Successive Approximation Register (SAR)-based trimming method applicable to the single adjustable strength current source. In some embodiments, the method comprises correcting, via the single adjustable strength current source, odd and even order harmonics. In some embodiments, the method comprises performing a dumping algorithm to remove even order harmonics.

In another example, an apparatus is provided which comprises: means for receiving an input signal and generating an output analog signal; means for converting the output analog signal to a digital representation; means for adjusting the input current, the DAC having a DAC cell having a single adjustable strength current source coupled to one of p-type or n-type current sources of the DAC cell; and means for receiving the digital representation and controlling the single adjustable strength current source according to the digital representation.

In some embodiments, the apparatus comprises means for selecting one of count-based or Successive Approximation Register (SAR)-based trimming method applicable to the single adjustable strength current source. In some embodiments, means for correcting, via the single adjustable strength current source, odd and even order harmonics. In some embodiments, means for performing a dumping algorithm to remove even order harmonics.

In another example, a system is provided which comprises: an antenna; a integrated circuit (IC) coupled to the antenna, the IC including an apparatus according to the apparatus described above; and a processor coupled to the IC.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
an amplifier having an input and an output;
a capacitor coupled to the input and the output of the amplifier;
a flash analog-to-digital converter coupled to the output of the amplifier;
a digital-to-analog converter coupled to an output of the flash analog-to-digital converter, wherein an output of the digital-to-analog converter is coupled to the input of the amplifier, and wherein the digital-to-analog converter is to provide a current as the output; and
a recovery circuit having an input coupled to the output of the flash analog-to-digital converter, wherein the recovery circuit has an output coupled to the input of the amplifier.

2. The apparatus of claim 1, wherein the digital-to-analog converter comprises an adjustable current source.

3. The apparatus of claim 2, wherein the digital-to-analog converter comprises:
a p-type current source coupled to a first supply node;
a n-type current source coupled to a second supply node;
a first p-type transistor coupled to the p-type current source; and
a first n-type transistor coupled to the n-type current source, wherein the adjustable current source is coupled to the n-type current source.

4. The apparatus of claim 3, wherein first supply node is a power supply node, and wherein the second supply node is a ground node.

5. The apparatus of claim 3, wherein the digital-to-analog converter comprises:

a second p-type transistor coupled to the p-type current source; and
a second n-type transistor coupled to the n-type current source.

6. The apparatus of claim 1, wherein the amplifier is part of an integrator.

7. The apparatus of claim 6, wherein the integrator is an active-RC integrator.

8. The apparatus of claim 1, wherein the digital-to-analog converter comprises a current steering apparatus.

9. The apparatus of claim 1, wherein the recovery circuit includes a programmable delay.

10. The apparatus of claim 1, wherein the digital-to-analog converter comprises:
a first current source comprising a p-type transistor coupled to a first supply node;
a second current source comprising a n-type transistor coupled to a second supply node;
a first p-type transistor coupled to the first current source; and
a first n-type transistor coupled to the second current source, wherein an adjustable current source is coupled to the n-type current source.

11. The apparatus of claim 10, wherein first supply node is a power supply node, and wherein the second supply node is a ground node.

12. An apparatus comprising:
means for integrating an analog input current and generating an analog output;
means for converting the analog output to a corresponding digital output;
means for converting the corresponding digital output to an analog current and for adjusting linearity of the means for converting the corresponding digital output;
means for recovering excess delay associated with the means for converting the analog output, and generating an output current; and
means for summing the analog current with the analog input current and the output current.

13. The apparatus of claim 12, wherein the means for converting the corresponding digital output includes means for current steering.

14. The apparatus of claim 12, wherein the means for integrating includes means for amplifying the analog input current.

15. A method comprising:
integrating an analog input current and generating an analog output;
converting the analog output to a corresponding digital output;
converting the corresponding digital output to an analog current;
adjusting linearity associated with the method of converting the corresponding digital output to the analog current;
recovering excess delay associated with the method of converting the analog output, and generating an output current; and
summing the analog current with the analog input current and the output current.

16. The method of claim 15 comprising converting the corresponding digital output using current steering.

17. The method of claim 15, wherein integrating the analog input current includes amplifying the analog input current.

18. An apparatus comprising:
a first amplifier having an input and an output;

a second amplifier having an input and an output;
a resistor coupled to the output of the first amplifier and the input of the second amplifier;
a first capacitor coupled to the input and the output of the first amplifier;
a second capacitor coupled to the input and the output of the second amplifier;
a flash analog-to-digital converter coupled to the output of the second amplifier;
a digital-to-analog converter coupled to an output of the flash analog-to-digital converter, wherein an output of the digital-to-analog converter is coupled to the input of the first amplifier, and wherein the digital-to-analog converter is to provide a current as the output; and
a recovery circuit having an input coupled to the output of the flash analog-to-digital converter, wherein the recovery circuit has an output coupled to the input of the first amplifier.

19. The apparatus of claim 18, wherein the digital-to-analog converter comprises:
a first current source comprising a p-type transistor coupled to a first supply node;
a second current source comprising a n-type transistor coupled to a second supply node;
a first p-type transistor coupled to the first current source; and
a first n-type transistor coupled to the second current source, wherein an adjustable current source is coupled to the n-type current source.

20. The apparatus of claim 19, wherein first supply node is a power supply node, and wherein the second supply node is a ground node.

21. The apparatus of claim 18, wherein the digital-to-analog converter comprises a current steering apparatus.

22. The apparatus of claim 18, wherein the recovery circuit includes a programmable delay.

23. A communication device comprising:
an antenna;
a low noise amplifier coupled to the antenna;
a mixer coupled to an output of the low noise amplifier;
a filter coupled to the output of the mixer; and
a sigma-delta modulator with linearity adjustability, wherein the sigma-delta modulator is coupled to the filter, wherein the sigma-delta modulator comprises:
an amplifier having an input and an output;
a capacitor coupled to the input and the output of the amplifier;
a flash analog-to-digital converter coupled to the output of the amplifier;
a digital-to-analog converter coupled to an output of the flash analog-to-digital converter, wherein an output of the digital-to-analog converter is coupled to the input of the amplifier; and
a compensation circuit having an input coupled to the output of the flash analog-to-digital converter, wherein the compensation circuit has an output coupled to the input of the amplifier.

24. The communication device of claim 23, wherein the mixer is a first mixer, wherein the filter is a first filter, wherein the sigma-delta modulator is a first sigma-delta modulator, and wherein the communication device comprises:
a second mixer coupled to an output of the low noise amplifier;
a second filter coupled to the output of the second mixer; and
a second sigma-delta modulator with linearity adjustability, wherein the second sigma-delta modulator is coupled to the second filter.

25. The communication device of claim 24, wherein the first mixer is to receive a first clock, wherein the second mixer is to receive a second clock, and wherein there the first clock and the second clock have different phases.

26. The communication device of claim 24, wherein the second sigma-delta modulators comprises:
an amplifier having an input and an output;
a capacitor coupled to the input and the output of the amplifier;
a flash analog-to-digital converter coupled to the output of the amplifier;
a digital-to-analog converter coupled to an output of the flash analog-to-digital converter, wherein an output of the digital-to-analog converter is coupled to the input of the amplifier; and
a compensation circuit having an input coupled to the output of the flash analog-to-digital converter, wherein the compensation circuit has an output coupled to the input of the amplifier.

27. An apparatus comprising:
an integrator to integrate an analog input current and for generating an analog output;
an analog-to-digital converter to convert the analog output to a corresponding digital output;
a digital-to-analog converter to convert the corresponding digital output to an analog current and to adjust linearity of analog-to digital converter;
a circuit to compensate excess delay associated with analog-to digital converter, wherein the circuit is to generate an output current; and
a node to sum the analog current with the analog input current and the output current,
wherein the digital-to-analog converter comprises:
a first current source comprising a p-type transistor coupled to a first supply node;
a second current source comprising a n-type transistor coupled to a second supply node;
a first p-type transistor coupled to the first current source; and
a first n-type transistor coupled to the second current source, wherein an adjustable current source is coupled to the n-type current source.

28. The apparatus of claim 27, wherein first supply node is a power supply node, and wherein the second supply node is a ground node.

29. The apparatus of claim 27, wherein the digital-to-analog converter comprises a current steering apparatus.

* * * * *